US006498097B1

(12) United States Patent
Park et al.

(10) Patent No.: US 6,498,097 B1
(45) Date of Patent: *Dec. 24, 2002

(54) APPARATUS AND METHOD OF FORMING PREFERRED ORIENTATION-CONTROLLED PLATINUM FILM USING OXYGEN

(75) Inventors: Dong Yeon Park; Dong Su Lee, both of Seoul; Hyun Jung Woo, Sungnam Kyunggi-Do; Dong Il Chun; Eui Joon Yoon, both of Seoul, all of (KR)

(73) Assignee: Tong Yang Cement Corporation, Seoul (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/059,638

(22) Filed: Apr. 13, 1998

(30) Foreign Application Priority Data

May 6, 1997 (KR) .............................................. 97-17209
May 6, 1997 (KR) .............................................. 97-17211

(51) Int. Cl.$^7$ .............................................. H01L 21/44
(52) U.S. Cl. ........................ 438/686; 438/650; 438/658; 438/660
(58) Field of Search ................................ 438/650, 658, 438/660, 686

(56) References Cited

U.S. PATENT DOCUMENTS

| 4,028,657 A | 6/1977 | Reichelt ...................... 338/307 |
| 4,103,275 A | 7/1978 | Diehl et al. .................... 338/25 |
| 4,129,848 A | 12/1978 | Frank et al. ................. 338/308 |
| 4,253,931 A | 3/1981 | Gold et al. ............. 204/192 SP |
| 4,375,056 A | 2/1983 | Baxter et al. .................. 338/25 |
| 4,396,899 A | 8/1983 | Ohno .......................... 338/34 |
| 4,804,438 A | 2/1989 | Rhodes ........................ 156/653 |
| 4,952,904 A | 8/1990 | Johnson et al. ................ 338/36 |
| 4,966,865 A | 10/1990 | Welch et al. ................ 437/192 |
| 5,104,684 A | 4/1992 | Tao et al. ....................... 427/38 |
| 5,142,437 A | 8/1992 | Kammerdiner et al. ...... 361/313 |
| 5,191,510 A | 3/1993 | Huffman ..................... 361/313 |
| 5,320,978 A | 6/1994 | Hsu ........................... 437/192 |
| 5,331,187 A | 7/1994 | Ogawa ........................ 257/295 |
| 5,348,894 A | 9/1994 | Gnade et al. .................. 437/12 |

(List continued on next page.)

OTHER PUBLICATIONS

Reed–Hill, Robert E. et al.j, "Miller Indicies" Physical Metallurgy Principles, PWS Publishing Co., Boston, 1992, pp. 13–16.*

M. Hecq and A. Hecq, "Oxygen Induced Preferred Orientation of DC Sputtered Platinum," *J. Vac. Sci. Technol.*, vol. 18, No. 2, Mar. 1981, pp. 219–222.

R.C. Budhani et al., "Summary Abstract: Oxygen Enhanced Adhesion of Platinum Films Deposited on Thermally Grown Alumina Surfaces," *J. Vac. Sci. Technol. A*, vol. 4, No. 6, Nov./Dec. 1986, , pp. 3023–3024.

(List continued on next page.)

*Primary Examiner*—Kevin M. Picardat
(74) *Attorney, Agent, or Firm*—Townsend and Townsend and Crew LLP (57) ABSTRACT

A platinum film orientation-controlled to (111), (200) and/or (220) is provided by depositing the platinum film under an atmosphere containing an oxygen component such as $O_2$, $O_3$, $N_2O$, $N_2+O_2$, or mixtures thereof as well as an inert gas (Ar, Ne, Kr, or Xe) on a substrate heated to a temperature ranged from room temperature to 700° C., and annealing to remove the gases introduced into the platinum film during the deposition thereof. The platinum film formed in this process has excellent electrical conductivity (resistivity is lower than 15 $\mu\Omega$-cm), good enough adhesion strength to be used for electronic devices, and does not show hillocks, voids or pinholes.

45 Claims, 7 Drawing Sheets

U.S. PATENT DOCUMENTS

| | | | |
|---|---|---|---|
| 5,440,173 A | 8/1995 | Evans, Jr. et al. | 257/751 |
| 5,453,294 A | 9/1995 | Ogi et al. | 427/100 |
| 5,471,072 A | 11/1995 | Papanicolaou | 257/77 |
| 5,498,569 A | 3/1996 | Eastep | 437/187 |
| 5,508,953 A | 4/1996 | Fukuda et al. | 365/145 |
| 5,512,151 A | 4/1996 | Hayamizu et al. | 204/192.15 |
| 5,514,484 A | 5/1996 | Nashimato | 428/700 |
| 5,650,202 A | 7/1997 | Mammone et al. | 427/536 |
| 5,656,382 A | 8/1997 | Nashimoto | 428/620 |
| 5,736,422 A * | 4/1998 | Lee et al. | 438/660 |
| 5,793,057 A * | 8/1998 | Summerfelt | 257/55 |
| 5,840,615 A * | 11/1998 | Aoki et al. | 438/396 |
| 5,846,859 A * | 12/1998 | Lee | 438/253 |

OTHER PUBLICATIONS

K.H. Park, et al., "Microstructures and Interdiffusions of Pt/Ti Electrodes With Respect To Annealing in the Oxygen Ambient," *J. Mater. Res.*, vol. 10, No. 7, Jul. 1995, pp. 1790–1794.

G. Cui et al., "Epitaxial Growth of Pt(001) Thin Films on MgO(001) Under Oxidizing Conditions," *Mat. Res. Soc. Symp. Proc.*, vol. 310, 1993, pp. 345–350.

K. Kushida–Abdelghafar, "Pt/TiN Electrodes for Stacked Memory With Polysilicon Plug Utilizing PZT Films," *Integrated Ferroelectrics*, vol. 13, 1996, pp. 113–119.

D.E. Kotecki, "High–K Dielectric Materials for DRAM Capacitors," *Semiconductor International*, Nov. 1996, pp. 109–110 and 112, 114 and 116.

D.S. Lee et al., "Characterization of Platinum Films Deposited By a Two–Step Magnetron Sputtering on $SiO_2$/Si Substrates," (Oct. 8, 1997 printout from http://www.tycl.co.kr/eng/mrs2.htm) from Materials Research Society Fall Meeting 1996 in Boston, Massachusetts, Nov. 8, 1996, 6 pages.

M.H. Kim et al., "Stress of Platinum Films Deposited By DC Magnetron Sputtering Using Argon/Oxygen Gas Mixture," (Oct. 8, 1997 printout from http://www.tycl.co.kr/eng/mrs2.htm) from Materials Research Society Fall Meeting 1996 in Boston, Massachusetts, Nov. 8, 1996, 5 pages.

D.Y. Park et al., "(100) Orientation Platinum Thin Films Deposited By DC Magnetron Sputtering On $SiO_2$/Si Substrates," (Oct. 8, 1997 printout from http://www.tycl.co.kr/eng/mrs2.htm) from Materials Research Society Fall Meeting 1996 in Boston, Massachusetts, Nov. 8, 1996, 5 pages.

K. Sreenivas et al., "Investigation of Pt/Ti Bilayer Metallization on Silicon for Ferroelectric Thin Film Integration," *J. Appl. Phys.*, vol. 75, No. 1, Jan. 1994, pp. 232–239.

B.S. Kwak et al., "Study of Epitaxial Platinum Films Grown by Metalorganic Chemical Vapor Deposition," *J. Appl. Phys.*, vol. 72, No. 8, 1992, pp. 3735–3740.

Staley, John, "Platinum Thin Films and Next–Generation Micromachined Sensors," *Sensors*, Apr. 1996, pp. 56–62.

H.N. Al–Shareef et al., "Electrodes for Ferroelectric Thin Films," *Integrated Ferroelectrics*, vol. 3, 1993, pp. 321–332.

P.D. Hren et al., "Bottom Electrodes for Integrated $Pb(Zr,Ti)O_3$ Films," *Integrated Ferroelectrics*, vol. 2, 1992, pp. 311–325.

G.A.C.M. Spierings et al., "Influence of Platinum–Based Electrodes on the Microstructure of Sol–Gel and MOD Prepared Lead Zirconate Titanate Films," *Integrated Ferroelectrics*, vol. 3, 1993, pp. 283–292.

G.A.C.M. Spierings et al., "Stresses in Pt/Pb(Zr,Ti)O3/Pt Thin–Film Stacks for Integrated Ferroelectric Capacitors," *J. Appl. Phys.*, vol. 78, No. 3, 1995, pp. 1926–1933.

D.H. Lee et al., "Microstructures and Pyroelectric Properties of $(Pb,La)TiO_3$ Thin Films Grown on MgO and on Pt/MgO," *Integrated Ferroelectrics*, vol. 5, 1995, pp. 125–132.

Hitoshi Tabata et al., "C–axis Preferred Orientation of Laser Ablated Epitaxial $PbTiO_3$ Films and Their Electrical Properties," *Appl. Phys. Lett.*, vol. 64, No. 4, 1994, pp. 428–430.

P.C. McIntyre et al., "Orientation Selection and Microstructural Evolution of Epitazial Pt Films on (001) MgO," *Mat. Res. Soc. Symp. Proc.*, vol. 355, 1995, Symposium held Nov. 28–Dec. 2, 1994 in Boston, Massachusetts, pp. 335–340.

R. Ramesh et al., "Oriented Ferroelectric La–Sr–Co–O/Pb–La–Zr–TiO/La–Sr–Co–O Heterostructures on (001) Pt/$SiO_2$ Si Substrates Using a Bismuth Titanate Template Layer," *Appl. Phys. Lett.*, vol. 64, No. 19, 1994, pp. 2511–2513.

R. Moazzami, "Ferroelectric Thin Film Technology for Semiconductor Memory," *Semicond. Sci, Technol.*, vol. 10, 1995, pp. 375–390.

M. Otsu et al., "Preparation of PZT Film on (100)Pt/(100)MgO Substrate by CVD and its Properties," *J. Ceram. Japan*, vol. 102, No. 2, 1994, pp. 126–132.

B.A. Tuttle et al., "Highly Oriented, Chemically Prepared $Pb(Zr,Ti)O_3$ Thin Films," *J. Am. Ceram. Soc.*, vol. 76, No. 6, 1995, pp. 1537–1544.

* cited by examiner

APPARATUS AND METHOD OF FORMING PREFERRED ORIENTATION-CONTROLLED PLATINUM FILM USING OXYGEN

CROSS-REFERENCE TO RELATED APPLICATIONS

This application claims priority from commonly-assigned Republic of Korea Application Serial No. P97-17209 (filed May 6, 1997) and Serial No. P97-17211 (filed May 6, 1997).

BACKGROUND OF THE INVENTION

The present invention relates to a technique for depositing a platinum film, which is used as a bottom electrode for memory cells or film sensors, and to a method of manufacturing such a film, particularly to a platinum film, which is deposited under an atmosphere containing an oxygen component ($O_2$, $O_3$, $O_2+N_2$, $N_2O$, or mixtures thereof) together with an inert gas (Ar, Ne, Kr or Xe) so that its orientation and microstructure can be controlled, and to an electronic device comprising such a platinum film as an electrode and a method of manufacturing the electronic device. In the below description, oxygen component means $O_2$, $O_3$, $O_2+N_2$, $N_2O$, or mixtures thereof. More particularly, the present invention relates to a technique improving characteristics of a platinum film in the course of manufacturing the platinum film used as a bottom electrode, wherein a preferred orientation of the platinum film is controlled toward a predetermined direction(s) and the platinum film is controlled to have a microstructure without any defects such as hillocks, pinholes and pores to be sufficiently useful as an electrode for memory cells, or ferroelectric sensor devices.

Semiconducting, dielectric, ferroelectric, superconductive and magnetic ceramic materials, used in electronic devices tend to become thinner in line with the trends of miniaturization, high-density integration and functional elevation of electronic ceramic parts or devices. Therefore, thin film type ceramic parts have been widely used in electronic industries. The substrates used for thin film type ceramic parts can be classified into three types. The first type comprises single crystal silicon generally referred to as silicon wafers. The second type comprises the other single crystals such as MgO, $SrTiO_3$ or $Al_2O_3$. The third type comprises polycrystal materials such as alumina or diamond. Among them, silicon wafers have been widely used in the conventional manufacturing processes of various types of electronic devices such as memory devices, or sensor devices.

Polysilicon has been widely used as a bottom electrode material in the conventional memory cells without any critical problems. However, it is generally accepted that polysilicon cannot be used any more as a bottom electrode to manufacture DRAMs (Dynamic Random Access Memories) with over 1 Gigabit and FRAMs (Ferroelectric Random Access Memories) which is a new type of non-volatile memory, because high dielectric or ferroelectric oxide thin films such as perovskite structure oxides, bismuth-layered perovskite structure oxides, tungsten-bronze type structure oxide, $ReMnO_3$ (Re: rare-earth element), and $BaMF_4$ (M: Mn, Co, Ni, Mg, Zn), are used on FRAMs, on DRAM devices requiring high degree of integration over 1 Gigabit, or around the core part of all types of oxide thin film sensors or actuators. That is, forming such high-dielectric oxide films requires an oxidation atmosphere and high temperature (higher than 500° C.), which may cause problems relating to the polysilicon. For example, if polysilicon is employed as the bottom electrode in a DRAM cell using high-dielectric material for a capacitor, serious problems may occur due to oxidation of the polysilicon under the high temperature (over 500° C.) and oxidation atmosphere during formation of the high-dielectric oxide thin films. For this reason, platinum is being investigated for use in place of polysilicon as an electrode of a memory cell employing a high-dielectric or ferroelectric oxide, because platinum is stable under high temperature and an oxidation atmosphere.

However, depositing platinum thin films by means of conventional methods has been known to pose a number of problems. First, the interface between an insulating oxide layer and the platinum layer does not allow chemical bonding, thereby weakening the adhesion strength between the platinum film and the substrate. One of the attempts that has been made to solve this problem is using an adhesion layer between a platinum layer and an insulating oxide layer. A thin film composed of any one or two of Ta, Ti, TiN or W has been formed on an insulating oxide layer before depositing a platinum thin film so that the thin film composed of any one or two of Ta, Ti, TiN or W serves as an adhesion layer between the insulating oxide layer and the platinum film.

However, employment of this method is known to not only complicate the process of forming a bottom electrode but also generate additional problems. In particular, oxygen gas introduced during the post-annealing or high-dielectric/ferroelectric oxide film depositing process can diffuse through voids formed between grain boundaries in the platinum film. Because the grains of the platinum films deposited by conventional processes have vertical columnar structures with inter-columnar voids, oxygen introduced from the above-mentioned process can easily diffuse through the platinum film to the adhesion layer. The oxygen gas diffused through the platinum film then oxidizes the adhesion layer and forms an oxidized insulation layer such as $TiO_2$ and $Ta_2O_5$ between the substrate and the platinum film. Consequently, the function of the platinum film as an electrode can become deteriorated or even lost. In particular, if the adhesion layer is formed from TiN, $N_2$ gas is produced while an oxidized layer of $TiO_2$ is formed on the surface of TiN layer, and the $N_2$ gas can cause the platinum film to expand and become released from adhesion layer. This phenomenon is known as "buckling."

In a conventional depositing method of a platinum thin film, hillocks, pinholes or pores are formed on the platinum film after annealing treatment or deposition of an oxide film. These hillocks, pinholes or buckling cause either shorting of the circuits or heterogeneity of a high dielectric or ferroelectric oxide layer.

Because of these problems, the use of oxide conductors such as $IrO_2$, $RuO_2$, LSCO, YBCO, etc., and platinum-oxide hybrid structures such as $IrO_2$/Pt, $RuO_2$/Pt, LSCO/Pt, YBCO/Pt, etc., as a bottom electrode have been investigated. However, when the former is used as the bottom electrode, the surface is not smooth enough and/or leakage currents increase. Furthermore, in the latter case, the manufacturing processes become complicated.

A solution for these disadvantages of conventional arts was addressed in two Korean patent applications (Serial Nos. 94-31618 filed Nov. 26, 1994 and 95-40450 filed Nov. 8, 1995) in the name of the present applicants. It is well known that oxygen may be contained in the depositing atmosphere when employing an insulating thin film on a substrate. The working effect of the two inventions addressed in said Korean applications filed in the name of the present applicants suggests a new technique. According to these inventions, a platinum thin film is deposited on an insulating oxide layer on a silicon wafer in two steps. The first step is to form a platinum thin film containing oxygen, as opposed to platinum, under an oxygen-containing atmosphere. The second step is to form a platinum layer on the Pt films formed at the first step under an inert gas atmosphere. The gases incorporated in the film during the first step are removed by annealing the film to a temperature higher than the decomposition temperatures of platinum oxides ($PtO_2$: higher than 450° C., PtO: higher than 550° C.). Through this annealing process, the oxygen contained in the platinum film during the deposition thereof is removed and the remaining platinum film becomes stable. As a result, an adhesion layer is not required and thus problems related to the adhesion layer are solved.

According to the description in said Korean applications, "an oxygen containing gaseous atmosphere" means a mixture of inert gas (Ar, Kr, Xe, or Ne) with either oxygen or ozone gas mixture, or a gas mixture containing oxygen. "A platinum thin film containing oxygen" means that oxygen is contained in the platinum layer, partially forming a platinum oxide, and partially forming an amorphous phase in the platinum layer.

In addition to the aforementioned disadvantages in the conventional arts, there still remains another unresolved problem that crystallographic orientations of platinum thin films are uncontrollable. It is well known that the properties of anisotropic crystals depend on their crystallographic orientations. The crystallographic orientations of oxide films formed on bottom electrodes depend on the crystallographic orientations of the bottom electrodes. Therefore, it is believed that controlling the preferred orientation of bottom electrodes is very important in controlling the preferred orientation of oxide films in order to have films with desirable physical properties.

It is expected in the pertinent technical field that, if a platinum thin film employed as a bottom electrode is deposited with a preferred (200) orientation, a ferroelectric oxide thin film, which is formed on the platinum thin film, could be mostly oriented to one direction (for example, c-axis). On the account of this preferred orientation, the working efficiency of the electronic device is expected to significantly increase, and its fatigue effect is expected to decrease.

It is known that a platinum thin film, which is deposited on an insulating oxide layer by the conventional methods, generally has a preferred (111) orientation. This is due to the fact that the plane with the minimum surface energy in metals with face centered cubic (FCC) structure is (111) and, considering only the surface energy at the depositing, the film is most stable if oriented toward (111).

Conventional methods for forming preferred orientation-controlled platinum films that have been suggested have limitations. One of such conventional methods is forming the platinum film on a single crystal substrate of the materials such as MgO, NaCl, KBr, $SrTiO_3$, $Al_2O_3$, and $LaAlO_3$. However, such a method not only is complicated in its process and incurs high unit costs for single-crystalline substrates but also is incompatible with the state-of-the art in manufacturing silicon-integrated circuits. Other conventional methods have formed orientation-controlled platinum films by depositing platinum on a glass substrate not on a silicon wafer, or by using a specially designed sputtering equipment which has an "auxiliary electrode" in order to deposit platinum film on silicon substrates. However, it has been reported that orientation-controlled platinum films deposited on glassy substrates have high resistivity (18 to 30 $\mu\Omega$-cm) since oxygen, which was introduced during the deposition thereof, has remained within the platinum films even after annealing for 10 days. Therefore, it has been thought to be difficult and impractical to apply this process to real manufacturing practices, due to the annealing condition.

It is seen from the above that the alternative and improved methods for forming preferred orientation-controlled platinum films onto silicon wafers as well as other substrates are needed. It is desirable that such methods be compatible with silicon-integrated circuit technology in some applications. It is also desirable that such preferred orientation-controlled platinum films have minimized pinholes, pores or hillocks in order to provide improved device performance.

The aforementioned drawbacks have been resolved by the invention disclosed in Korean Patent Application No. 96-7663 filed on Mar. 21, 1996 (corresponding U.S. application Ser. No. 08/688,521, filed Jul. 30, 1996) by the present applicants' technology of depositing a platinum film having a preferred (200) orientation on a silicon wafer under an atmosphere containing oxygen. According to that invention, platinum thin films deposited on a silicon wafer with an insulating oxide layer have good adhesion strength and a preferred (200) orientation.

Therefore, to date, there has been no report of desirable results with depositing a platinum film on a silicon substrate in such a manner that the platinum film has a microstructure that can be controlled; an orientation that can be controlled to (111), (200), or (220); and an excellent conductivity desirable for application to DRAM, FRAM or sensor devices.

SUMMARY OF THE INVENTION

It is therefore an objective of the present invention to provide a method of manufacturing a platinum film, the orientation and microstructure of which can be controlled irrespective of the employment of an adhesion layer formed thereon, and such platinum film manufactured thereby.

It is still another objective of the present invention to provide a method of manufacturing an electronic device comprising an orientation-controlled platinum film and an electronic device manufactured thereby.

According to one aspect of the present invention to achieve the above objectives, the present invention provides a method of forming a platinum film on a substrate. The method includes the steps of: providing a substrate; depositing platinum on an upper surface of the substrate under an inert gas atmosphere containing an oxygen component ($O_2$, $O_3$, $N_2+O_2$, $N_2O$, or mixtures thereof) to deposit a platinum film containing oxygen; and annealing the platinum film containing the oxygen component at a temperature between 450° C. to 1,000° C. which is higher than the decomposition temperatures of the platinum oxides to remove the gases incorporated into the platinum films during the deposition. Orientation of such a platinum film can be controlled by changing at least one of the following parameters: the partial pressure ratio of the oxygen component to the entire gas containing the inert gas and oxygen component, the temperature of the substrate during the deposition, and the annealing conditions. The platinum film can be formed through two or more deposition steps, according to specific embodiments.

In accordance with the present invention, the platinum film may be deposited by employing any one of the following methods: direct current or radio frequency (DC/RF)

magnetron sputtering, DC/RF sputtering, metal organic chemical vapor deposition, partially ionized beam deposition, vacuum evaporation, laser ablation, and electroplating.

In other embodiments, the method forming a platinum film described above can be applied to a process for manufacturing an electronic device by forming a high-dielectric or ferroelectric oxide film on the platinum film. In this case, for example, the platinum film functions as a bottom electrode. Depending on types of electronic devices to which the film is applied, a functional intermediate film (such as an insulation layer, a conductive plug, an adhesion layer, or a diffusion barrier layer) may be provided between the platinum film and the substrate, according to various specific embodiments. In accordance with other specific embodiments, the present invention provides an electronic device with preferable characteristics required for memory cells or sensor devices.

The present invention along with its features and advantages will now be explained in detail with reference to the attached drawings illustrating preferred embodiments of the present invention.

DESCRIPTION OF THE SPECIFIC EMBODIMENTS

The present invention provides a method of manufacturing an orientation-controlled platinum film and a platinum film formed thereby, according to specific embodiments. In accordance with other specific embodiments, the present invention also provides a method of manufacturing an electronic device comprising an orientation-controlled platinum film and an electronic device manufactured thereby. Various specific embodiments of the present invention provide methods of freely controlling a preferred orientation of a platinum film by depositing a platinum film under an atmosphere containing an oxygen component, and then annealing so that the orientation of the platinum film becomes (111), (200) and/or (220).

In particular, various specific embodiments of the present invention are generally described below in relation to FIGS. 1a to 1c, FIG. 2, FIGS. 3a to 3d, and FIG. 4. In these specific embodiments, the present invention provides for a preferred orientation-controlled platinum film that is formed over a substrate. According to specific embodiments, the present invention deposits a platinum film on a substrate under an atmosphere containing an oxygen component together with an inert gas to deposit a platinum film containing the oxygen component; and anneals the platinum film containing the oxygen component to remove the oxygen component from the platinum film, whereby orientation of the platinum film can be controlled by changing at least one of the following parameters: the partial pressure ratio of the oxygen component to the entire gas containing the inert gas and the oxygen component, the temperature of the substrate during the deposition, and the annealing conditions. An inert gas can be selected from Ar, Ne, Kr or Xe, in accordance with specific embodiments. The present invention can be applied to a process manufacturing an electronic device. In some embodiments, a ferroelectric film may be formed on the platinum film, with the platinum film functioning, for example, as a bottom electrode. In some specific embodiments, depending on types of electronic devices to which the platinum film is applied, a functional intermediate film (such as an insulation layer, a conductive plug, an adhesion layer, or a diffusion barrier layer) may be provided between the platinum film and the substrate. Various materials that may be used for the different films are discussed in detail below and have general applicability to the following description of the specific embodiments.

The material of the substrate may be selected from one of the following groups: single component semiconductor materials, e.g., silicon (Si), germanium (Ge) and diamond (C); compound semiconductor materials, e.g., GaAs, InP, SiGe and SiC; ceramic single crystals, e.g., $SrTiO_3$, $LaAlO_3$, $Al_2O_3$, KBr, NaCl, $ZrO_2$, $Si_3N_4$, $TiO_2$, $Ta_2O_5$, AlN or ceramic poly-crystals, e.g., $SrTiO_3$, $LaAlO_3$, $Al_2O_3$, KBr, NaCl, MgO, $ZrO_2$, $Si_3N_4$, $TiO_2$, $Ta_2O_5$, AlN; metals, e.g., Au, Ag, Al, Ir, Pt, Cu, Pd, Ru, W; and amorphous/glassy materials, e.g., BSG, PSG, BPSG, Si.

The materials used for a functional intermediate film functioning as an insulating layer include $SiO_2$, $Si_3N_4$, BPSG, MgO, CaO, $CaF_2$, $Al_2O_3$, $ZrO_2$, $TiO_2$, or $B_2O_3$.

In accordance with the present invention, the platinum film may be deposited by employing any one of the following methods: DC/RF magnetron sputtering, DC/RF sputtering, metal organic chemical vapor deposition, partially ionized beam deposition, vacuum evaporation, laser ablation, and electroplating.

A method manufacturing an electronic device comprising a platinum film according to the present invention includes a step of forming a high-dielectric/ferroelectric film on a top surface of a platinum film after depositing the platinum film. For example, materials used for the high-dielectric film or the ferroelectric film may be selected from any one of the following groups: perovskite structure oxides, such as $BT(BaTiO_3)$, $BST(Ba_{1-x}Sr_xTiO_3)$, $ST(SrTiO_3)$, $PT(PbTiO_3)$, $PZT(Pb(Zr,Ti)O_3)$, $PLT(Pb_{1-x}La_xTiO_3)$, PLZT $(x/y/zPb_{1-x}La_x)(Z_yTi_z)_{1-x/4}O_3$, $PMN(PbMg_{1/3}Nb_{2/3}O_3)$, $LiTaO_3$, $KNbO_3$, $K(Ta, Nb)O_3$, $CaTiO_3$, $SrSnO_3$, $NaNbO_3$, $LaAlO_3$, and $YAlO_3$; bismuth-layered perovskite structure oxides, such as $SrBiNbO_9$, $SrBi_2Ti_2O_9$, $SrBi_2Ta_2O_9$, $SrBi_2(Ta_xNb_{1-x})_2O_9$ and $Bi_4Ti_3O_{12}$; a tungsten-bronze type structure oxide, such as $Sr_{1-x}Ba_xNb_2O_6$, $(Sr, Ba)_{0.8}R_xNa_{0.4}Nb_2O_6$(R; Cr, Zn, Y), $(Pb, Ba)Nb_2O_6$, $(K, Sr)Nb_2O_6$, $(Pb, K)Nb_2O_6$, $Pb_2KNb_5O_{15}$, $K_3Li_2Nb_5O_{15}$, $(K, Na)_3Li_2Nb_5O_{15}$, and $K_2LiNb_5O_{15}$; $ReMnO_3$ (where Re is a rare-earth element); $BaMF_4$ (where M is Mn, Co, Mg, or Zn); and $KMgF_3$.

Figure 1A:
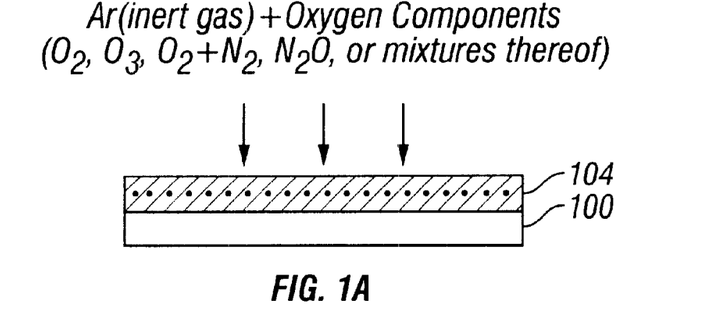
FIGS. 1a to 1c are cross-sectional views illustrating the steps of manufacturing an electronic device comprising a platinum thin film formed according to one aspect of the present invention.
Figure 1B:
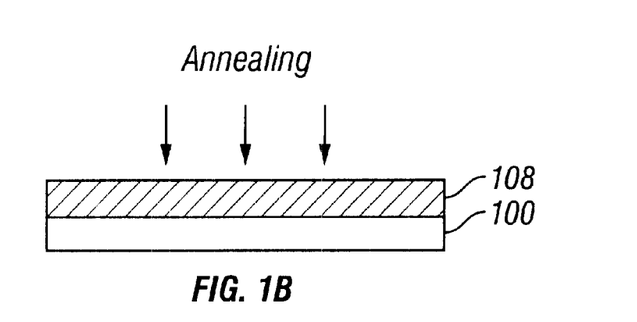
Figure 1C:
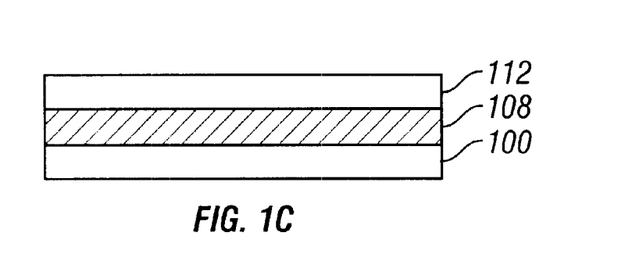

Specifically, FIGS. 1a to 1c are schematic cross-sectional views illustrating the steps of manufacturing an electronic device comprising a platinum film deposited according to one aspect of the present invention.

Referring to FIG. 1a, a platinum film 104 is deposited on a top surface of the substrate 100. The depositing atmosphere contains an inert gas (Ar, Ne, Xe, or Kr) and an oxygen component, and under the temperature range between room temperature and 500° C. Accordingly, an oxygen component is contained in the platinum film 104. Referring to FIG. 1b, the platinum film 104 formed on the substrate 100 is annealed under the temperature range between 450° C. and 1,000° C. to remove the oxygen component from the platinum film 104. This process converts the platinum film 104 into the platinum film 108 that is substantially free from the oxygen component. The platinum film 108 has a high-dielectric/ferroelectric oxide film 112 thereon, as shown FIG. 1c, so that it can be used as a bottom electrode in DRAM cells or non-volatile high-dielectric/ferroelectric memory cells or sensor devices. Though not illustrated in the drawings, electronic devices such as capacitors can be manufactured by forming a top electrode comprising the material identical with that of the bottom electrode, i.e., platinum or other conductive material.

For the embodiment of FIGS. 1a to 1c, preferred orientation of the platinum film formed according to the above method can be controlled by at least any one of the following parameters: the partial pressure ratio of the oxygen component to the entire gas containing the inert gas and the oxygen component, the temperature of the substrate during the deposition, and the annealing conditions.

Figure 2:
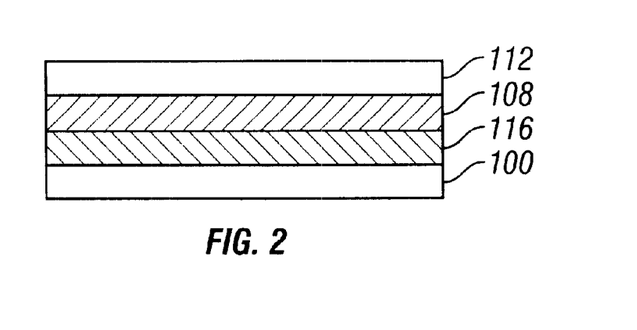
FIG. 2 is a cross-sectional view illustrating a modification to the method of FIGS. 1a to 1c, in which an insulation layer is deposited to electrically separate the substrate from the platinum film, in accordance with another embodiment of the present invention.

FIG. 2 is a cross sectional view illustrating a modification to the method of FIGS. 1a to 1c. Referring to FIG. 2, an insulating layer 116 such as $SiO_2$ or $Si_3N_4$ is formed between the substrate 100 and the platinum film 108 to be formed on the top surface of the substrate 100. The platinum film 108 formed on the insulating layer 116 is deposited under an atmosphere containing the oxygen component together with an inert gas and then annealed as shown in FIG. 1b. In this embodiment, orientation of the platinum film can be controlled by changing at least one of the following parameters: the partial pressure ratio of the oxygen component to the entire gas containing the inert gas and the oxygen component, the temperature of the substrate during the deposition, and the annealing conditions.

Figure 3A:
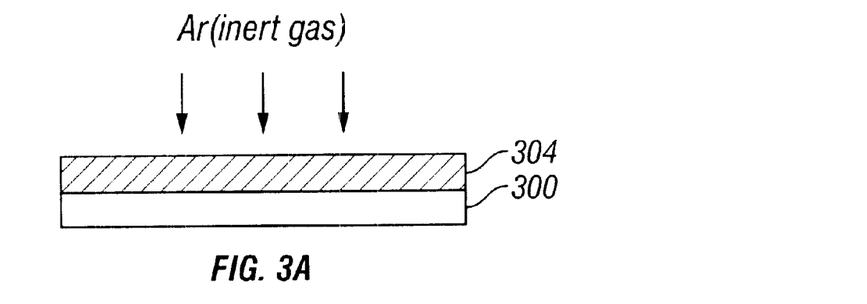
FIGS. 3a to 3d are cross-sectional views illustrating the steps of another modification to the method of FIGS. 1a to 1c, in accordance with yet another embodiment of the present invention.
Figure 3B:
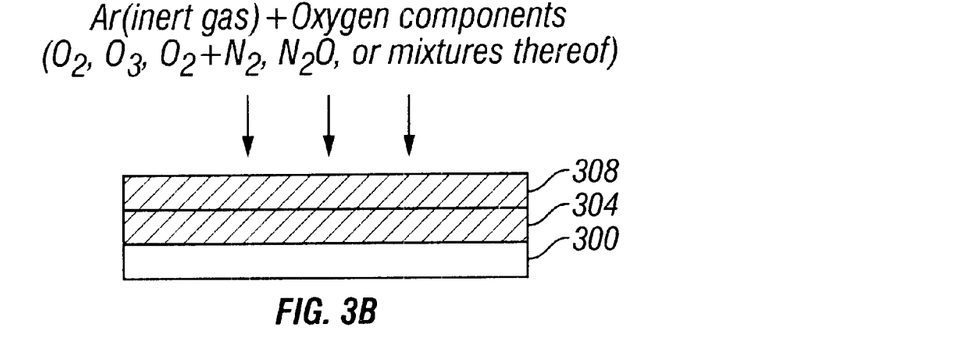
Figure 3C:
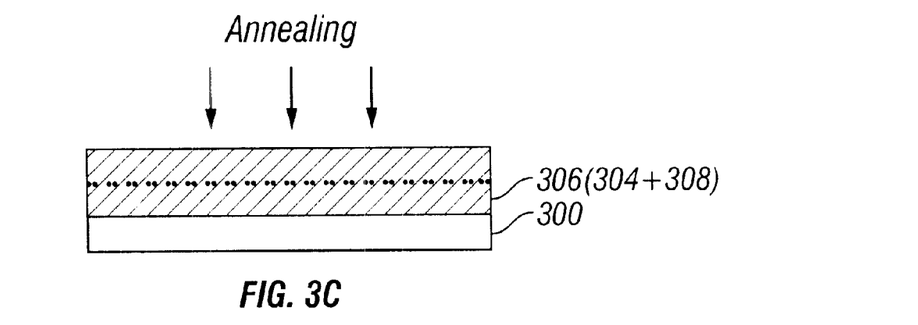
Figure 3D:
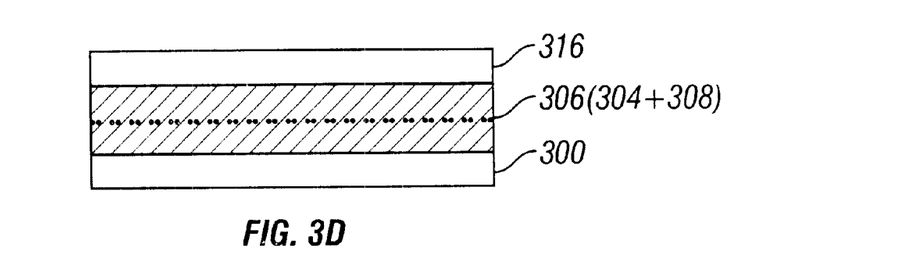

Alternatively, a platinum film can be deposited in two or more separate steps as shown in FIGS. 3a to 3d which show the steps manufacturing an electronic device comprising a platinum film deposited according to another aspect of the present invention. Referring to FIG. 3a, a first thickness part 304 of the platinum film is deposited on the top surface of a substrate 300 under an inert gas atmosphere. Following this, a second thickness part 308 of the platinum film is deposited on the top surface of the first thickness part 304 under an atmosphere containing an oxygen component together with an inert gas as shown in FIG. 3b. FIG. 3c shows an annealing process to remove the gases incorporated during sputtering of the second thickness part 308. This process converts the platinum films 304 and 308 to the platinum film 306 that is substantially free of the oxygen component. As shown in FIG. 3d, an electronic device such as a capacitor is produced by forming a high-dielectric/ferroelectric oxide film 316 on the top surface of the annealed platinum film 306(304+308) and forming a top electrode (not shown in FIG. 3d) made from the same material as that of the bottom electrode or other conductive materials.

Figure 4:
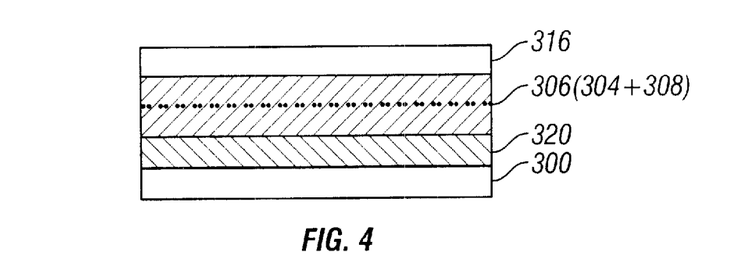
FIG. 4 is a cross-sectional view illustrating a modification to the method of FIGS. 3a to 3d, in which an insulation layer is interposed between the substrate and the platinum film, in accordance with a further embodiment of the present invention.

FIG. 4 is a cross-sectional view illustrating a modification to the method illustrated in FIGS. 3a to 3d, in which an insulating layer 320 is deposited for insulation between the substrate 300 and the platinum film 306.

Merely as examples, FIGS. 3a to 3d and 4 illustrate methods depositing a platinum film in only two steps. However, the platinum film can also be deposited in three or more steps, according to other specific embodiments. When depositing in three or more steps, inert gas of argon alone is employed in the first step to form a platinum film of the first deposited thickness. Argon gas mixed with the oxygen component is employed in the second step to deposit a platinum film of a second deposited thickness. A platinum film of a third deposited thickness can be deposited in the remaining steps by employing an inert gas or a mixture of an inert gas with an oxygen component.

Description of Exemplary Integrated Circuit Device

Figure 5:
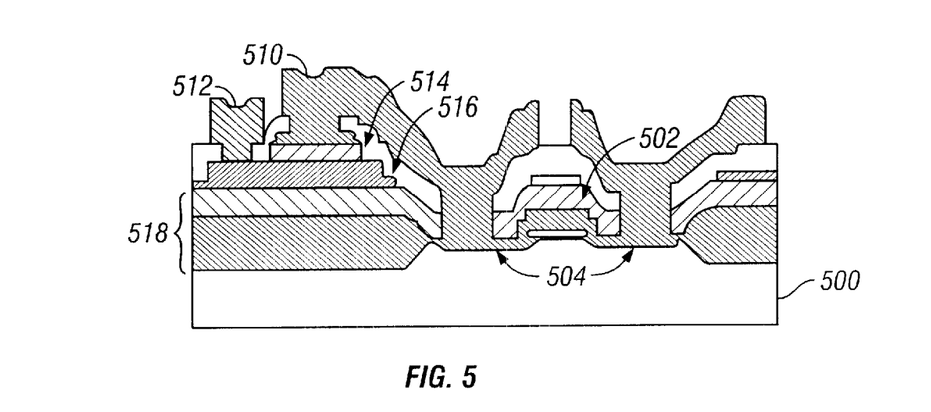
FIG. 5 is a schematic cross-sectional view of non-volatile ferroelectric memory device, in accordance with a specific embodiment of the present invention.

FIG. 5 represents a schematic diagram of an exemplary integrated circuit device, such as a non-volatile ferroelectric memory device, which may also be fabricated in accordance with the present invention. As seen in FIG. 5, formed in the cell region of a substrate 500 is a transistor having a gate electrode 502 and source/drain regions 504. Also formed in the non-volatile ferroelectric memory device is a ferroelectric capacitor. The capacitor includes a top capacitor electrode 510, a bottom capacitor electrode 512, and a ferroelectric material 514 (e.g., PZT) formed between electrodes 510 and 512. Formed underneath the bottom capacitor electrode 512 is a buffer layer 516 (e.g., $TiO_2$) formed over an insulating layer 518 on substrate 500. As discussed above, the present invention may be used to deposit orientation-controlled platinum for use as bottom electrode 512 and/or upper electrode 510.

FIG. 5 is merely a representative example of integrated circuit devices which may be fabricated in accordance with specific embodiments of the present invention. Of course, other devices also may be fabricated in accordance with other specific embodiments.

Description of Exemplary Substrate Processing Apparatus

In accordance with the present invention, the platinum film may be deposited by employing any one of the following methods: DC/RF magnetron sputtering, DC/RF sputtering, metal organic chemical vapor deposition, partially ionized beam deposition, vacuum evaporation, laser ablation, and electroplating.

Figure 6:
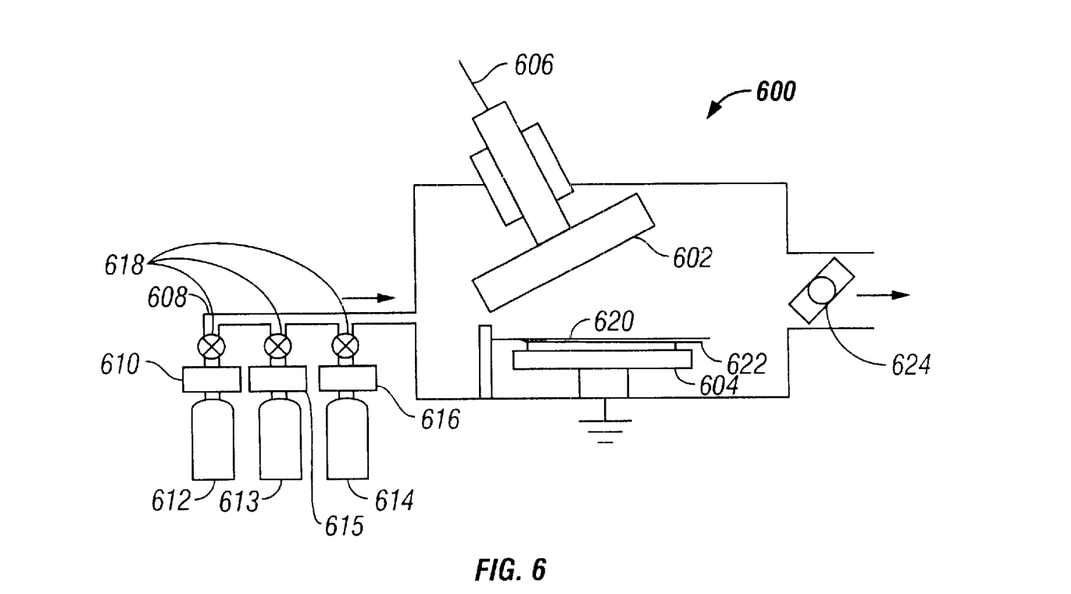
FIG. 6 is a simplified diagram illustrating an exemplary substrate processing apparatus which may be used in accordance with a specific embodiment of the present invention.

FIG. 6 is a simplified diagram illustrating an exemplary substrate processing apparatus, such as a DC sputtering apparatus 600, which may be used in accordance with a specific embodiment of the present invention. In the exemplary sputter deposition system of FIG. 6, a platinum target 602 (a plate of the platinum material that is to be deposited)

is connected to a DC power supply 606 (alternatively, in a RF sputtering system, target 602 is connected to a RF power supply) at a negative voltage and about 100 Watt to 200 Watt power while a substrate holder 604 facing target 602 is grounded (as seen in the specific embodiment of FIG. 6) or/and heated by a heater under substrate holder 604. In specific embodiments, platinum target 602 may be a 2 inch, 4 inch or 6 inch diameter target for a 2 inch, 4 inch or 6 inch diameter substrate, respectively. In the specific embodiment discussed below, a 4 inch diameter was used for target 602 and the substrate. An inert gas, such as argon in the specific embodiment, is flowed through a gas line 608 at a rate controlled by a mass flow controller 610 into the system from an argon source 612. As mentioned earlier, an inert gas can be selected from Ar, Ne, Kr or Xe, in accordance with various specific embodiments. In embodiments where nitrogen is used, nitrogen also is flowed from a nitrogen source 614 through a gas line 608 at a rate controlled by a mass flow controller 616. Oxygen also is flowed from an oxygen source 613 through a gas line 608 at a rate controlled by a mass flow controller 615. In the specific embodiment, valves 618 are also used for inert gas source 612, oxygen source 613 and nitrogen source 614. In the specific embodiment, the system is typically maintained at a basic pressure on the order of below $10^{-6}$ Torr. The glow discharge can be initiated and maintained in the mTorr range by using an exhaust valve 624. When the glow discharge is started, positive ions strike target 602, and target platinum atoms are removed by momentum transfer. When a sliding shutter 620 is adjusted to expose substrate holder 604, these target platinum atoms subsequently condense into a thin platinum film on a substrate 622, which is on substrate holder 604. Target 602 and substrate holder 604 are tilted to each other by about 30° in the specific embodiment. Substrate holder 604 rotates during sputter deposition for obtaining uniform platinum film deposition over substrate 622 at a rotating speed of about 3 revolutions per minute (rpm), according to the specific embodiment. Prior to sputter deposition, substrate 622 was loaded using a magnetic bar into system 600 through a load lock chamber (not shown) coupled to the main chamber containing substrate holder 604. During sputter deposition, the total gas pressure within the main chamber of system 600 is controlled to a set value by exhaust valve 624, which is connected to a pumping system (not shown). Exhaust valve 624 also controls the flow of exhaust from system 600. It is noted that no auxiliary electrode is required with the exemplary sputtering deposition system 600 in order to deposit a preferred orientation-controlled platinum film onto substrate 622, which is a silicon substrate in the specific embodiment. For some embodiments, a magnetron gun may also be used to provide DC/RF magnetron sputtering.

Description of Exemplary Platinum Deposition Processes

Exemplary processing conditions and variables for sputter depositing preferred orientation-controlled platinum using an inert gas, such as argon in the specific embodiment, and oxygen gas are described as follows. In controlling the preferred orientation of the deposited platinum film, four variables are important: (i) the substrate temperature ($T_S$) which is, more specifically for the specific embodiment, the temperature of the substrate surface during the deposition; (ii) the oxygen gas content in the gas ($F_{O_2}$ (in %)=100×($O_2$ partial pressure/total gas pressure)); (iii) the total gas pressure ($P_{tot}$=inert gas partial pressure+$O_2$ partial pressure), which is, more specifically for the specific embodiment, the total gas pressure during film deposition; and (iv) the film deposition rate (DR (in/minute)=film thickness/time spent in film deposition). These four variables determine many properties of the deposited platinum film, such as preferred orientation, hillock and/or pinhole formation, residual stress in the film, etc. In order to make orientation-controlled, defect-free platinum thin films, each of these variables preferably should be controlled within some ranges, as discussed generally below.

Deposition Conditions for Preferred (200) Orientation-controlled Platinum Films

FIGS. 7a to 7d illustrate the relationship between the degree (in %) of preferred (200) orientation in the deposited platinum film and the variation of the above-discussed four deposition process variables. In particular, the degree of preferred (200) orientation in the deposited platinum film is defined as follows:

$$f_{(200)} = 100 \times [(I_{(200)})/(I_{(111)} + I_{(200)} + I_{(220)})](\%)$$

where $I_{(hkl)}$ is the X-ray diffraction intensity of the (hkl) plane.

Figure 7A:
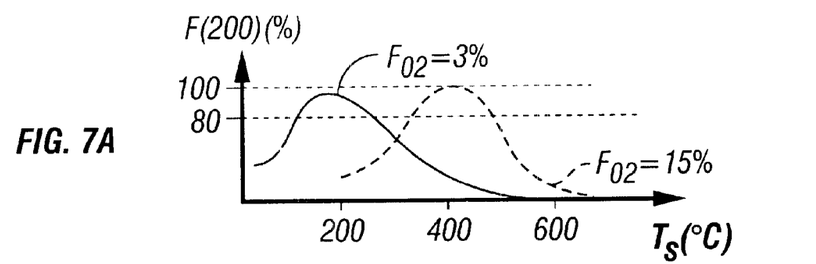
FIGS. 7a to 7d illustrate the relationship between the degree (in %) of preferred (200) orientation in the deposited platinum film and the variation of four deposition process variables, according to a specific embodiment.

FIG. 7a illustrates the effect of changing the substrate temperature $T_S$ on the degree of preferred (200) orientation. For the data shown in FIG. 7a, $P_{tot}$=2 mTorr and DR=130 Å/min. With low oxygen content ($F_{O_2}$=3%), the range of $T_S$ for obtaining (200) orientation is lower than the range of the case with higher oxygen content ($F_{O_2}$=15%), as shown in FIG. 7a. Close to 100% of preferred (200) orientation-controlled platinum film is obtained for $F_{O_2}$=3% at a substrate temperature of about 180° C.; whereas, close to 100% of preferred (200) orientation-controlled platinum film is obtained for $F_{O_2}$=15% at a substrate temperature of about 410° C.

Figure 7B:
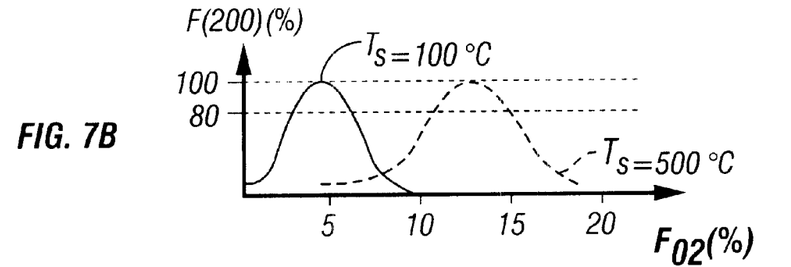

FIG. 7b illustrates the effect of changing the oxygen content ($F_{O_2}$) on the degree of preferred (200) orientation. For the data shown in FIG. 7b, $P_{tot}$=10 mTorr and DR=150 Å/min. At a lower $T_S$ (100° C.), the range of oxygen content for obtaining a preferred (200) orientation is lower than that of the case at a higher $T_S$ (500° C.), as shown in FIG. 7b. Almost 100% of preferred (200) orientation-controlled platinum film is obtained for the oxygen content of about 5% when depositing at a substrate temperature of 100° C. In contrast, almost 100% of preferred (200) orientation-controlled platinum film is obtained for the oxygen content of about 13% when depositing at a substrate temperature of 500° C.

Figure 7C:
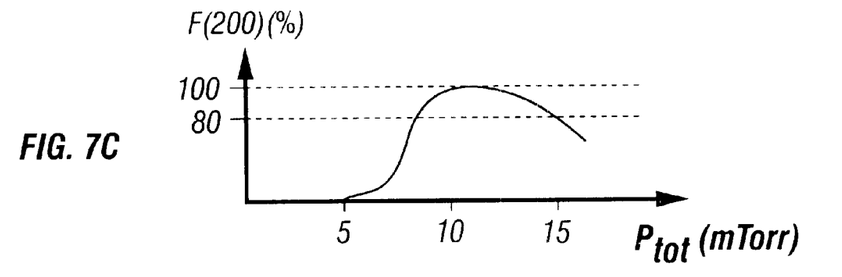

FIG. 7c illustrates the effect of changing the total gas pressure ($P_{tot}$) on the degree of preferred (200) orientation. For the data shown in FIG. 7c, $F_{O_2}$=6%, Ts=300° C., and DR=150 Å/min. As seen in FIG. 7c, total gas pressure should be in the range of about 10–12 mTorr in order to obtain close to 100% of preferred (200) orientation-controlled platinum film.

Figure 7D:
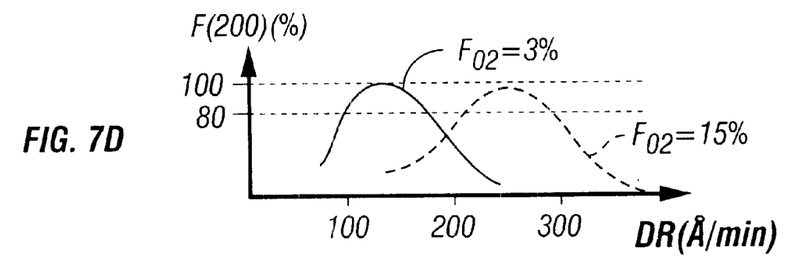

FIG. 7d illustrates the effect of deposition rate on the degree of preferred (200) orientation. For the data shown in FIG. 7d, $P_{tot}$=10 mTorr and $T_S$=300° C. With low oxygen content ($F_{O_2}$=3%), the range of deposition rates for obtaining preferred (200) orientation-controlled platinum film is lower than the range of the case with higher oxygen content ($F_{O_2}$=15%), as shown in FIG. 7d. In particular, almost 100% of preferred (200) orientation-controlled platinum film is obtained for $F_{O_2}$=3% at a deposition rate of about 140 Å/min whereas, close to 100% of preferred (200) orientation-controlled platinum film is obtained for $F_{O_2}$=15% at a deposition rate of about 200 Å/min.

From the above figures showing the relation between the degree of preferred (200) orientation and four deposition processing variables, the preferred ranges for the deposition conditions in argon and oxygen gas deposition atmosphere where found to be as follows: $T_S$ of about 100° C. to about 500°C.; $Fo_2$ of about 3–15%; $P_{tot}$ of about 10–12 mTorr; and DR of about 120–270 Å/min.

Deposition Conditions for Preferred (111) Orientation-controlled Platinum Films

Similar experiments were performed in order to obtain the preferred deposition conditions for the preferred (111) orientation-controlled platinum films, except using the degree of preferred (111) orientation in the deposited platinum film defined as follows:

$$f_{(111)}=100\times[(I_{(111)})/(I_{(111)}+I_{(200)}+I_{(220)})](\%)$$

where $I_{(hkl)}$ is the X-ray diffraction intensity of the (hkl) plane. Platinum films having the preferred (111) orientation were deposited in experiments to determine preferred conditions. For preferred (111) orientation-controlled platinum films, the preferred ranges for the deposition conditions in argon and oxygen gas deposition atmosphere were found to be as follows: $T_S$ of about 100° C. to about 600° C.; $Fo_2$ of about 1–10%; $P_{tot}$ of about 5–7 mTorr; and DR of about 80–240 Å/min. Under these processing condition ranges, preferred (111) orientation-controlled platinum films that were defect-free could be achieved. It was noted that the higher the substrate temperature, the higher oxygen content that is required. Further, it was seen that if $P_{tot}$ is too low and the oxygen content is too high, many hillocks formed on the preferred (111) orientation-controlled platinum films. It was also seen that if $P_{tot}$ is too high and the oxygen content is too low, many pinholes formed on the preferred (111) orientation-controlled platinum films.

Deposition Conditions for Preferred (220) Orientation-controlled Platinum

Similar experiments were performed in order to obtain the preferred deposition conditions for the preferred (220) orientation-controlled platinum films, except using the degree of preferred (220) orientation in the deposited platinum film defined as follows:

$$f_{(220)}=100\times[(I_{(220)})/(I_{(111)}+I_{(200)}+I_{(220)})](\%)$$

where $I_{(hkl)}$ is the X-ray diffraction intensity of the (hkl) plane. Platinum films having the preferred (220) orientation were deposited in experiments to determine preferred conditions. For preferred (220) orientation-controlled platinum films, the preferred ranges for the deposition conditions in argon and oxygen gas deposition atmosphere were found to be as follows: $T_S$ of about 100° C. to about 500° C.; $Fo_2$ of about 15–25%; $P_{tot}$ of about 5–6 mTorr; and DR of about 100–300 Å/min. Under these processing condition ranges, preferred (220) orientation-controlled platinum films that were defect-free could be achieved. Preferred (220) platinum films are obtained at low pressure and high oxygen content. If the gas pressure is too low, many hillocks formed on the films.

It is noted that the values of these four process variables may not be universal (i.e., the value of a certain variable to achieve some property of the film may vary according to the specific substrate processing apparatus used). For example, these variables may vary depending on the geometrical factors of chamber volume, target-substrate distance and other properties, such as the magnetic field intensity of the magnetron gun if a magnetron sputtering apparatus is used.

Besides the importance of these process variables during the deposition, the annealing conditions are also important for obtaining preferred orientation-controlled and defect-free platinum films. In order to remove most of the oxygen component gas from the deposited platinum film, the annealing temperature range is preferably from about 450° C. to about 1000° C.

Experimental Results

EXAMPLE 1

Figure 8A:
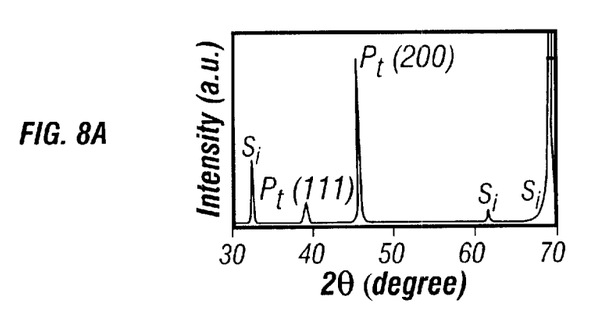
FIGS. 8a to 8h are graphs illustrating X-ray diffraction (XRD) patterns of platinum films deposited in accordance with examples 1 to 8.

An insulation layer of $SiO_2$ was formed on a silicon wafer. A platinum film of 2000 Å thickness was deposited on the insulation layer under an atmosphere containing oxygen.
- Deposition method: DC magnetron sputtering
- Depositing atmosphere: $Ar+O_2$
- MAYO Partial pressure ratio of oxygen to the entire depositing atmosphere: 10%
- Substrate temperature: room temperature
- Annealing conditions: 800° C. for two hours under an air atmosphere The platinum film formed in this example 1 has a preferred (200) orientation as shown in FIG. 8a.

EXAMPLE 2

Figure 8B:
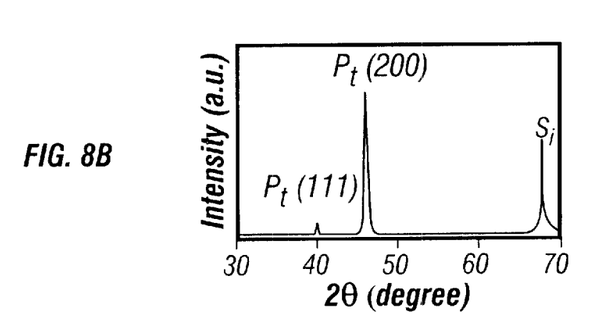

The deposition was performed under the same conditions as in the Example 1 except that the temperature of the substrate was changed to 300° C. and the annealing conditions were changed to 700° C. for one hour. The platinum film has a preferred (200) orientation as shown in FIG. 8b.

EXAMPLE 3

Figure 8C:
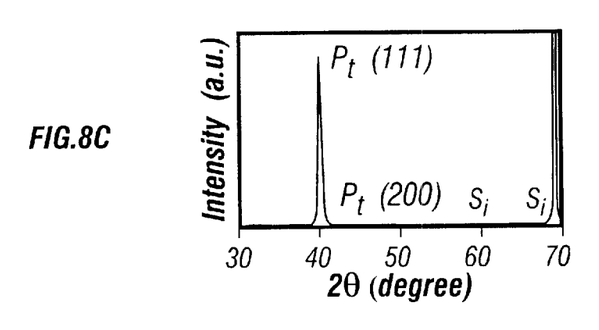

An insulation layer of $SiO_2$ was formed on a silicon wafer. Following this, a platinum film of 2,000 Å thickness was formed on the insulation layer under an atmosphere containing oxygen.
- Deposition method: DC magnetron sputtering
- Deposition atmosphere: $Ar+O_2$
- Partial pressure ratio of oxygen to the entire depositing atmosphere: 30%
- Substrate temperature: 600° C.
- Annealing conditions: 700° C. for one hour under an air atmosphere The platinum film deposited under the above condition has a preferred (111) orientation as shown in FIG. 8c.

EXAMPLE 4

Figure 8D:
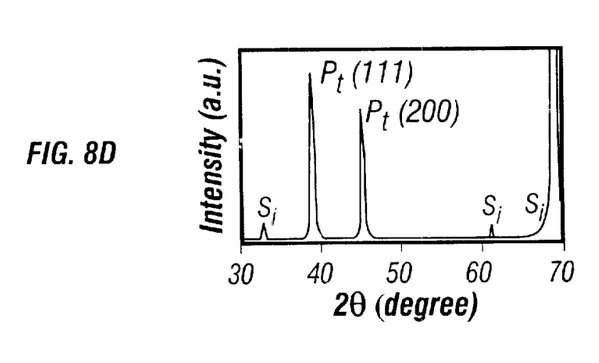

An insulation layer of $SiO_2$ was formed on a silicon wafer. Following this, a platinum film of 2,000 Å thickness was formed on the insulation layer under an atmosphere containing oxygen.
- Deposition method: DC magnetron sputtering
- Deposition atmosphere: $Ar+O_2$
- Partial pressure ratio of oxygen to the entire depositing atmosphere: 15%
- Substrate temperature: 400° C.
- Annealing conditions: 700° C. for one hour under an air atmosphere The platinum film has a mixed {(111) and (200)} orientation as shown in FIG. 8d.

EXAMPLE 5

Figure 8E:
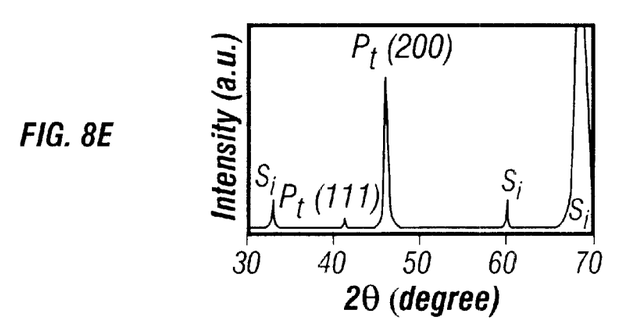

An insulation layer of $SiO_2$ was formed on a silicon wafer. Following this, a platinum film of 2,000 Å thickness was deposited on the insulation layer under an atmosphere containing an oxygen component.
- Deposition method: DC magnetron sputtering
- Deposition atmosphere: $Ar+(O_2+N_2)$mixture ○ Partial pressure ratio of oxygen-nitrogen containing gas mixture to the entire depositing atmosphere: 10%
○ Substrate temperature: 300° C.
○ Annealing conditions: 600° C. for one hour under an air atmosphere As can be seen from FIG. 8e, the preferred orientation of the platinum film is (200).

EXAMPLE 6

Figure 8F:
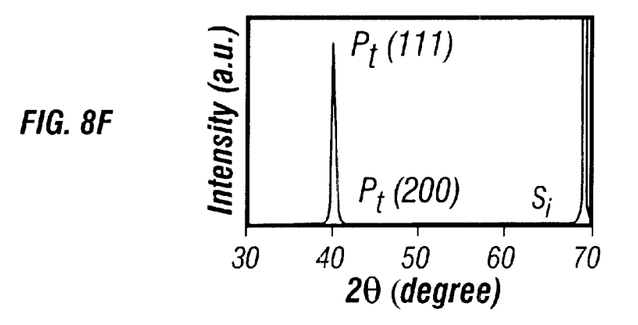

Experimental conditions were same with those in Example 5 except that the substrate temperature was changed to 500° C. The platinum film obtained has a preferred (111) orientation as shown in FIG. 8f.

EXAMPLE 7

Figure 8G:
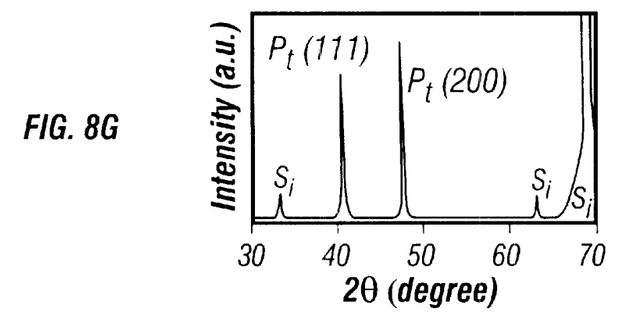

Experimental conditions were the same as those in Example 5 expect that the substrate temperature was changed to room temperature. The platinum film obtained has a mixed {(111) and (200)} orientation as shown in FIG. 8g.

EXAMPLE 8

In this example, an insulation layer of SiO$_2$ was formed on a silicon wafer and then a platinum film of 2,000 Å thickness was deposited on the insulation layer under an atmosphere containing oxygen.

Figure 8H:
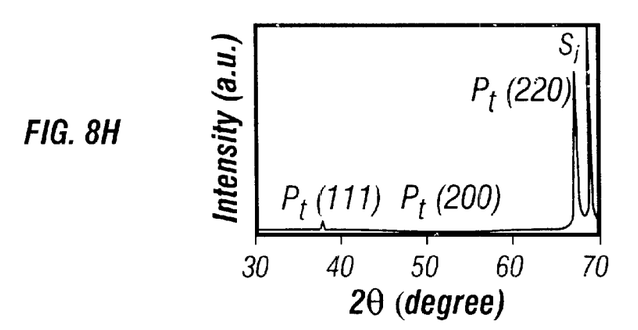

○ Deposition method: DC magnetron sputtering
○ Depositing atmosphere: Ar+O$_2$
○ Partial pressure ratio of oxygen to the entire depositing atmosphere: 25%
○ Substrate temperature: 200° C.
○ Annealing conditions: 600° C. for one hour under an air atmosphere The platinum film has a preferred (220) orientation as shown in FIG. 8h.

Figure 9A:
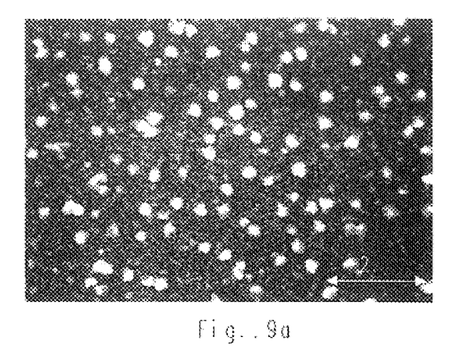
FIGS. 9a and 9b are scanning electron microscope micrographs showing a 10,000-times magnified planar view and a 50,000-times magnified cross-sectional view, respectively, of the platinum film deposited by a prior art method.
Figure 9B:
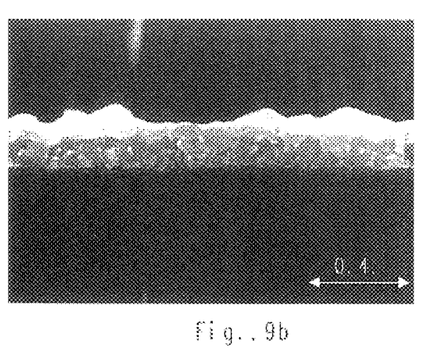
Figure 9C:
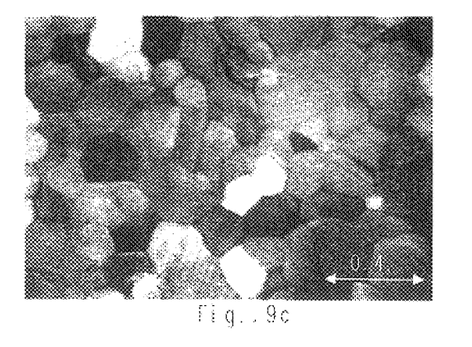
FIGS. 9c and 9d are scanning electron microscope micrographs showing 50,000-times magnified planar and cross-sectional views, respectively, of the platinum film deposited by example 3 according to a specific embodiment of the present invention.
Figure 9D:
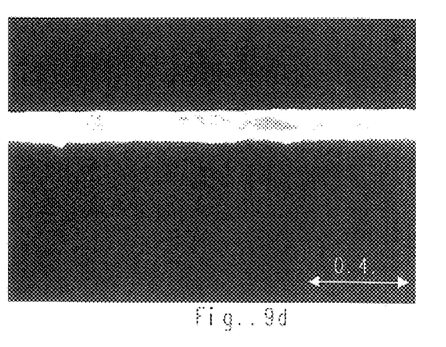

FIGS. 9a and 9b are scanning electron microscope micrographs showing a 10,000-times magnified planar view and a 50,000-times magnified cross-sectional view, respectively, of the platinum film deposited by a prior art method. In this prior art method, a platinum film is coated on a titanium adhesion layer deposited on a SiO$_2$ substrate in an argon atmosphere, and then annealed for one hour at 600° C. The many white spots observed in FIG. 9a are hillocks or protrusions in the platinum film of the prior art. Moreover, it is clearly seen in the cross-sectional view of FIG. 9b that the platinum film of the prior art has a very rough surface as a result of these hillocks. FIGS. 9c and 9d are scanning electron microscope micrographs showing 50,000-times magnified planar and cross-sectional views, respectively, of the platinum film deposited by Example 3 according to the present invention. In contrast with the prior art platinum film, the platinum film of a specific embodiment of the present invention appears to be free of hillocks or other defects, as seen in FIG. 9c. Moreover, the cross-sectional view of FIG. 9d demonstrates that the surface of the platinum film is smooth. This example shows that the platinum film deposited by the present invention has no hillocks or any other defects.

The platinum films formed in the other Examples show the same results. This means that the platinum films formed according to the present invention are orientation-controllable, and have dense structures showing no hillocks, pinholes or buckling unlike the platinum films formed according to the prior arts. The platinum films formed in accordance with the present invention show an excellent electrical conductivity and the resistivity thereof is lower than 15 $\mu\Omega$-cm.

It is clear from the above description that the preferred orientation of a platinum film can be controlled by varying at least one of the following parameters: the partial pressure ratio of the oxygen component to the entire gas containing the inert gas and oxygen component, the temperature of the substrate during the deposition, and the annealing conditions.

Since the orientation of the platinum film is freely controllable, it is possible to form a platinum film having desired characteristics for a particular electronic device which uses the platinum film as a bottom electrode.

What is claimed is:

1. A method of forming a platinum film on a silicon substrate comprising: providing the silicon substrate;
    forming an insulation layer on a top surface of the silicon substrate;
    depositing a platinum film on a top surface of the insulation layer under an atmosphere of an inert gas mixed with an oxygen component to obtain a platinum film containing oxygen;
    annealing the platinum film containing oxygen at a temperature which is higher than the decomposition temperatures of platinum oxides to substantially remove gases incorporated into the platinum film during the depositing; and
    controlling orientation of the platinum film on the substrate to (111), (200), or (220), or a combination thereof, wherein the orientation of the platinum film is controlled by controlling at least the annealing conditions.

2. The method of claim 1, wherein the orientation of the platinum film is controlled by controlling the annealing conditions and at least one of the following parameters: a partial pressure ratio of the oxygen component to the inert gas and oxygen component and the temperature of the substrate during the depositing step.

3. The method of claim 1, wherein the inert gas is any one of Ar, Ne, Kr or Me.

4. The method of claim 1, wherein a partial pressure ratio of the oxygen component to the inert gas and oxygen component is less than 50%.

5. The method of claim 1, wherein a temperature of the substrate during the depositing ranges between room temperature and 700° C.

6. The method of claim 1, wherein the orientation is controlled so that a degree of preferred orientation of the platinum film expressed in the following equation is greater than 80%:

$$f_{(hkl)} = \frac{I_{(hkl)}}{\sum I_{(hkl)}} \times 100(\%)$$

where
(hkl): (111), (200), (220),
I: Intensity of an X-ray diffraction, and
$\Sigma I_{(hkl)} = I_{(111)} + I_{(200)} + I_{(220)}$.

7. The method of claim 1, wherein the insulation layer is formed from a material selected from the group consisting of SiO$_2$, Si$_3$N$_4$, BPSG, MgO, CaO, CaF$_2$, Al$_2$O$_3$, B$_2$O$_3$, BSG or PSG.

8. The method of claim 1, wherein the deposition of platinum film is performed by DC/RF sputtering, DC/RF magnetron sputtering, metal organic chemical vapor deposition, vacuum evaporation, laser ablation, partially ionized beam deposition, or electroplating.

9. The method of claim 2, wherein the orientation of the platinum film is controlled by controlling all of the following parameters: the partial pressure ratio of the oxygen component to the inert gas and oxygen component, the temperature of the substrate during the depositing, and the annealing conditions.

10. The method of claim 1, wherein the temperature at which the platinum film is annealed is between 450° C. and 1,000° C.

11. The method of claim 1, wherein the oxygen component is one selected from the group of $O_2$, $O_3$, $N_2O_2$, $N_2+O_2$, and a combination thereof.

12. The method of claim 1, wherein the annealing step converts the platinum film to have a microstructure without any substantial hillock and pinholes defects.

13. The method of claim 1, wherein the annealed platinum film has resistivity of no more than 15 $\mu\Omega$-cm.

14. A method of manufacturing an orientation-controlled platinum film comprising:
    providing a substrate;
    depositing a platinum film on the substrate under an atmosphere of an inert gas mixed with an oxygen component to obtain a platinum film containing the oxygen component; and
    annealing the platinum film containing the oxygen component under a temperature between 450° C. and 1,000° C. to substantially remove gases incorporated into the platinum film during the depositing;
    controlling orientation of the platinum film on the substrate to (111), (200), or (220), or a combination thereof, wherein the orientation of the platinum film is controlled using all of the following parameters: a partial pressure ratio of the oxygen component to the inert gas and oxygen component, a temperature of the substrate during the depositing step and annealing conditions.

15. The method of claim 14, further comprising
    forming an insulation layer on an upper surface of the substrate before depositing the platinum film.

16. The method of claim 15, wherein the insulation layer is formed from a material selected from the group consisting of $SiO_2$, $Si_3N_4$, BPSG, MgO, CaO, $CaF_2$, $Al_2O_3$, $B_2O_3$, BSG or PSG.

17. The method of claim 14, wherein the inert gas is any one of Ar, Ne, Kr or Xe.

18. The method of claim 14, wherein a partial pressure ratio of the oxygen component to the inert gas and oxygen component is less than 50%.

19. The method of claim 14, wherein a temperature of the substrate during the depositing ranges between room temperature and 700° C.

20. The method of claim 14, wherein the orientation is controlled so that a degree of preferred orientation of the platinum film expressed in the following equation is greater than 80%:

$$f_{(hkl)} = \frac{I_{(hkl)}}{\Sigma I_{(hkl)}} \times 100(\%)$$

where
    (hkl): (111), (200), (220),
    I: Intensity of an X-ray diffraction, and
    $\Sigma I_{(hkl)} = I_{(111)} + I_{(200)} + I_{(220)}$.

21. The method of claim 14, wherein the platinum film after annealing has a resistivity less than 15 $\mu\Omega$-cm.

22. The method of claim 14, wherein the deposition of platinum film is performed by DC/RF sputtering, DC/RF magnetron sputtering, metal organic chemical vapor deposition, vacuum evaporation, laser ablation, partially ionized beam deposition, or electroplating.

23. The method of claim 14, wherein the substrate is formed from a material selected from the group consisting of:
    single-component semiconductors selected from the group consisting of Si, Ge, and C;
    compound semiconductors selected from the group consisting of GaAs, InP, SiGe, and SiC;
    single-crystalline ceramics selected from the group consisting of $SrTiO_3$, $LaAlO_3$, $Al_2O_3$, KBr, NaCl, MgO, $ZrO_2$, $Si_3N_4$, $TiO_2$, $Ta_2O_5$, and AlN;
    poly-crystalline ceramics selected from the group consisting of Si, $SrTiO_3$, $LaAlO_3$, MgO, KBr, NaCl, $Al_2O_3$, $ZrO_2$, $Si_3N_4$, $TiO_2$, $Ta_2O_5$, and AlN;
    metals selected from the group consisting of Au, Ag, Al, Ir, Pt, Cu, Pd, Ru, and W; and
    amorphous/glassy materials selected from the group consisting of BSG, PSG, BPSG, and Si.

24. A method of manufacturing an electronic device incorporating a platinum film comprising:
    providing a substrate;
    depositing the platinum film on a top surface of the substrate under an atmosphere of an inert gas mixed with an oxygen component annealing the platinum film containing the oxygen component under a temperature between 450° C. and 1,000° C. to substantially remove the gases incorporated into the platinum film during the deposition;
    controlling orientation of the platinum film on the substrate to (111), (200), or (220), or a combination thereof by controlling the annealing conditions; and
    forming a high dielectric/ferroelectric film on the top surface of the platinum film.

25. The method of claim 24, wherein the orientation of the platinum film is controlled by controlling all of the following parameters: controlling two or more of the following parameters: a partial pressure ratio of the oxygen component to the inert gas and oxygen component, the temperature of the substrate during the depositing, and the annealing conditions.

26. The method of claim 24, further comprising
    forming an insulation layer on the upper surface of the substrate before depositing the platinum film.

27. The method of claim 26, wherein the insulation layer is formed from a material selected from the group consisting of $SiO_2$, $Si_3N_4$, BPSG, MgO, CaO, $CaF_2$, $Al_2O_3$, $B_2O_3$, BSG or PSG.

28. The method of claim 24, wherein the inert gas is any one of Ar, Ne, Kr or Xe.

29. The method of claim 24, wherein a partial pressure ratio of the oxygen component to the inert gas and oxygen component is less than 50%.

30. The method of claim 24, wherein a temperature of the substrate ranges between room temperature and 700° C.

31. The method of claim 24, wherein the orientation is controlled so that a degree of preferred orientation of the platinum film expressed in the following equation is greater than 80%:

$$f_{(hkl)} = \frac{I_{(hkl)}}{\sum I_{(hkl)}} \times 100(\%)$$

where (hkl): (111), (200), (220),

I: Intensity of an X-ray diffraction, and $\Sigma I_{(hkl)} = I_{(111)} + I_{(200)} + I_{(220)}$.

32. The method of claim 24, wherein the deposition of platinum film is performed by DC/RF sputtering, DC/RF magnetron sputtering, metal organic chemical vapor deposition, vacuum evaporation, laser ablation, partially ionized beam deposition, or electroplating.

33. The method of claim 24, wherein the substrate is formed from a material selected from the group consisting of:

single-component semiconductors selected from the group consisting of Si, Ge, and C.;

compound semiconductors selected from the group consisting of GaAs, InP, SiGe, and SiC;

single-crystalline ceramics selected from the group consisting of $SrTiO_3$, $LaAlO_3$, sapphire, KBr, NaCl, $ZrO_2$, $Si_3N_4$, $TiO_2$, $Ta_2O_5$, and AlN;

poly-crystalline ceramics selected from the group consisting of Si, $SrTiO_3$, $LaAlO_3$, MgO, KBr, NaCl, $Al_2O_3$, $ZrO_2$, $Si_3N_4$, $TiO_2$, $Ta_2O_5$, and AlN;

metals selected from the group consisting of Au, Ag, Al, Ir, Pt, Cu, Pd, Ru, and W; and amorphous/glassy materials selected from the group consisting of BSG, PSG, BPSG, and Si.

34. The method of claim 24, wherein the high-dielectric or ferroelectric oxide film is formed from a material selected from the group comprising perovskite structure oxides {BT ($BaTiO_3$), BST($Ba_{1-x}Sr_xTiO_3$), ST($SrTiO_3$), PT($PbTiO_3$), PZT(Pb(Zr, Ti)$O_3$, PLT($Pb_{1-x}La_xTiO_3$), PLZT($Pb_{1-x}La_x$)($Zr_yTi_z$)$_{1-x/4}O_3$, PMN(PbMg$_{1/3}$Nb$_{2/3}O_3$), $LiNbO_3$, $LiTaO_3$, $KNbO_3$, K(Ta, Nb)$O_3$, $CaTiO_3$, $SrSnO_3$, $NaNbO_3$, $LaAlO_3$, and $YAlO_3$}, bismuth-layered perovskite structure oxides {$SrBi_2Nb_2O_9$, $SrBi_2Ti_2O_9$, $SrBi_2Ta_2O_9$, $SrBi_2(Ta_xNb_{1-x})_2O_9$, $Bi_4Ti_3O_{12}$}, tungsten-bronze type structure oxides {$Sr_{1-x}Ba_xNb_2O_6$, (Sr, Ba)$_{0.8}R_xNa_{0.4}Nb_2O_6$(R:Cr, Zn, Y), (Pb, Ba)Nb$_2O_6$, (K, Sr)Nb$_2O_6$, (Pb, K)Nb$_2O_6$, $Pb_2KNb_5O_{15}$, $K_3Li_2Nb_5O_{15}$, (K, Na)$_3Li_2Nb_5O_{15}$, $K_2BiNb_5O_{15}$}, ReMnO$_3$ (Re: rare-earth element), BaMF$_4$ (M:Mn, Co, Ni, Mg, Zn), and KMgF$_3$.

35. A method of manufacturing an electronic device incorporating a platinum film comprising:

providing a substrate;

depositing a bottom electrode of platinum or conductive oxide on a top surface of substrate;

forming a high dielectric/ferroelectric film on a top surface of the bottom electrode;

depositing a platinum film as a top electrode on a top surface of the high dielectric/ferroelectric film under an atmosphere of an inert gas mixed with an oxygen component to obtain a platinum film containing the oxygen component;

upon depositing the platinum film, annealing the platinum film containing the oxygen component under a temperature between 450° C. and 1,000° C. to substantially remove the gases incorporated into the platinum film during the deposition; and controlling orientation of the platinum film on the substrate to (111), (200), or (220), or a combination thereof by controlling all of the following parameters: a temperature of the substrate during the depositing, a partial pressure ratio of the oxygen component to the inert gas and oxygen component, and annealing conditions.

36. The method of claim 35, wherein the orientation of the platinum film is controlled by at least one of the following parameters: controlling two or more of the following parameters: a partial pressure ratio of the oxygen component to the inert gas and oxygen component, the temperature of the substrate during the depositing, and the annealing conditions.

37. The method of claim 35, further comprising forming an insulation layer on the upper surface of the substrate before depositing the platinum film.

38. The method of claim 37, wherein the insulation layer is formed from a material selected from the group consisting of $SiO_2$, $Si_3N_4$, BPSG, MgO, CaO, $CaF_2$, $Al_2O_3$, $B_2O_3$, BSG or PSG.

39. The method of claim 35, wherein the inert gas is any one of Ar, Ne, Kr or Xe.

40. The method of claim 35, wherein a partial pressure ratio of the oxygen component to the inert gas and oxygen component is less than 50%.

41. The method of claim 35, wherein a temperature of the substrate ranges between room temperature and 700° C.

42. The method of claim 35, wherein the orientation is controlled so that a degree of preferred orientation of the platinum film expressed in the following equation is greater than 80%:

$$f_{(hkl)} = \frac{I_{(hkl)}}{\sum I_{(hkl)}} \times 100(\%)$$

where (hkl): (111), (200), (220),

I: Intensity of an X-ray diffraction, and $\Sigma I_{(hkl)} = I_{(111)} + I_{(200)} + I_{(220)}$.

43. The method of claim 35, wherein the deposition of platinum film is performed by DC/RF sputtering, DCIRF magnetron sputtering, metal organic chemical vapor deposition, vacuum evaporation, laser ablation, partially ionized beam deposition, or electroplating.

44. A method of forming a platinum film on a silicon substrate comprising: providing the silicon substrate;

forming an insulation layer on a top surface of the silicon substrate;

depositing a platinum film on a top surface of the insulation layer under an atmosphere of an inert gas mixed with an oxygen component to obtain a platinum film containing oxygen;

upon depositing the platinum film, annealing the platinum film containing oxygen at a temperature which is higher than the decomposition temperatures of platinum oxides to substantially remove gases incorporated into the platinum film during the depositing; and controlling orientation of the platinum film on the substrate to (111), (200), or (220), or a combination thereof by controlling at least the annealing conditions.

45. The method of claim 44, wherein the temperature at which the platinum film is annealed is between 450° C. and 1,000° C.

* * * * *